United States Patent [19]

Fitzpatrick et al.

[11] Patent Number: 4,871,931

[45] Date of Patent: Oct. 3, 1989

[54] LOGIC CIRCUIT RESISTANT TO ERRORS DUE TO SUPPLY FLUCTUATIONS

[75] Inventors: Mark E. Fitzpatrick, San Jose; Gary R. Gouldsberry, Cupertino; Yat-Sum Chan; Richard F. Pang, both of San Jose, all of Calif.

[73] Assignee: Gazelle Microcircuits, Inc., Santa Clara, Calif.

[21] Appl. No.: 115,147

[22] Filed: Oct. 30, 1987

[51] Int. Cl.[4] .................. H03K 17/16; H03K 5/22; G06G 7/10

[52] U.S. Cl. .................. 307/491; 307/443; 307/355; 307/360; 307/362; 307/530

[58] Field of Search .......... 307/443, 448, 455, 491, 307/530, 355, 360, 362

[56] References Cited

U.S. PATENT DOCUMENTS 4,001,605  1/1977  Thomas et al. .................. 307/357
4,551,639  11/1985  Takeda et al. .................. 307/455

Primary Examiner—Stanley D. Miller
Assistant Examiner—M. R. Wambach
Attorney, Agent, or Firm—Skjerven, Morrill, MacPherson, Franklin & Friel

[57] ABSTRACT

An improved logic circuit is disclosed, of the type in which one or more input signals, generated by one or more input signal generator circuits, are referenced to a threshold voltage, determined by a threshold voltage generator circuit, to determine whether said one or more input signals are in a high or low state. In this improved logic circuit, the time constants of the input signal generator circuits are matched with those of the threshold voltage generator circuit so that any power supply perturbations commonly applied to the input signal generator circuits and threshold voltage generator circuit, such as due to the switching on or off of output loads, will result in these circuits having substantially identical frequency responses and amplitude versus time responses.

14 Claims, 2 Drawing Sheets

LOGIC CIRCUIT RESISTANT TO ERRORS DUE TO SUPPLY FLUCTUATIONS

BACKGROUND OF THE INVENTION

1. Field of the Invention

This invention relates to logic circuits of the type which sense the level of one or more input signals by referencing said one or more input signals to a threshold level, and in particular to an improved logic circuit which is unaffected by large and abrupt changes in supply voltage.

2. Description of the Prior Art

FIG. 1 illustrates a representative prior art logic circuit 5, which includes input signal generator 6, differential logic circuit 7, and reference voltage generator 8, all having power supplied by supply voltage $V_{cc}$. It is to be noted that the present invention can be applied to a variety of logic circuits whether they be analog or digital, or whether or not the logic circuit requires a reference voltage to establish a threshold voltage for determining a high or low state of a signal. What is important, however, is that the logic circuit have a 25 threshold voltage related to a certain voltage level, such as a power supply voltage level, and the level of an input signal to be referenced to the threshold voltage is also 28 related to the certain voltage level.

In FIG. 1, input signal generator 6 generates an input voltage $V_{in}$ which is to be compared to a reference voltage $V_{ref}$, generated by reference voltage generator 8, to determine whether $V_{in}$ represents a high or low state. If $V_{in}$ is greater than $V_{ref}$, $V_{ref}$ being approximately equal to $[V_{in}(\text{high})+V_{in}(\text{low})]/2$, differential logic circuit 7 generates an output signal $V_{out}$ which will be at, for example, a high state. The design of input signal generator 6 and reference voltage generator 8 is such that the two circuits will respond similarly to changes in ambient temperature and low frequency variations in supply voltage $V_{cc}$. The output $V_{out}$ of differential logic circuit 7 is not affected by the amplitudes of $V_{in}$ and $V_{ref}$ increasing or decreasing together due to these temperature and supply voltage variations, since it is the difference between the two signals that is measured. Differential logic circuit 7 also isolates the more sensitive input signal generator 6 from output circuits coupled to $V_{out}$.

If supply voltage $V_{cc}$ were to undergo an abrupt change, such as a voltage spike, the amplitudes of $V_{in}$ and $V_{ref}$ may not correspond identically since the frequency responses and amplitude versus time responses of input signal generator 6 and reference voltage generator 8, as determined by the time constants of each circuit, may not be identical.

Generally, for lower frequency perturbations in supply voltage $V_{cc}$, the time constants of both circuits are so small in comparison to the rate of change of $V_{cc}$ that they have negligible effect on the responses of these circuits to these $V_{cc}$ perturbations. Thus, the circuits will respond similarly without causing an erroneous output voltage $V_{out}$ to be generated. However, for very abrupt changes in supply voltage $V_{cc}$, such as when an inductive output load is switched on or off and generates a di/dt related voltage spike on the power supply line, the difference in time constants of the two circuits may be large enough for $V_{in}$ and $V_{ref}$ to vary in amplitude at significantly different rates and possibly cause an erroneous output voltage $V_{out}$ to result.

FIG. 2 illustrates a case wherein one power supply is used to power both an output circuit, controlled by $V_{out}$, and logic circuit 5 of FIG. 1. Steady state amplitudes of supply voltage $V_{cc}$, input voltage $V_{in}$, reference voltage $V_{ref}$, and output voltage $V_{out}$ are shown from time T0 to T1. As seen, $V_{in}$ is below $V_{ref}$, which, in this case, causes $V_{out}$ to be at a low state. At T1, a voltage spike on the power line causes $V_{cc}$ to rise rapidly. This abrupt increase in supply voltage $V_{cc}$ causes a slightly delayed but sudden increase in $V_{in}$, this increase being determined by the time constants of input signal generator 6, and causes a slower increase in $V_{ref}$, due to reference voltage generator 8 having larger time constants. At T2, $V_{in}$ rises above $V_{ref}$, causing $V_{out}$ to go high and to thus send an erroneous output voltage to the output circuit. At T3, $V_{in}$ falls below $V_{ref}$, due to $V_{ref}$ still rising and $V_{in}$ starting to fall, and $V_{out}$ is switched to a low state. At T4, proper operation of the logic circuit resumes. To avoid these erroneous output voltages, prior art logic circuits typically employ two independent power supplies: one to power the sensitive logic circuits, and the other to power the output buffer circuits and output loads. The additional power supply increases the cost and space requirements to support the logic circuit and adds complexity to the integrated circuit containing the logic circuit due to at least two power supply pins being required. Prior art logic circuits which employ one power supply must have the permissible voltage deviations between the threshold voltage level and input signals increased to accommodate these differing responses to voltage spikes, causing a concomitant lowering in switching speed.

SUMMARY

Disclosed herein is an improved logic circuit of the type in which one or more input signals are referenced to a threshold voltage level to determine whether said one or more input signals are above or below said threshold voltage level, and wherein said input signals and said threshold voltage level are related to a common voltage, such as a power supply voltage. In this improved logic circuit, the effective time constants of one or more input signal generators, generating said input signals, are matched with those of the circuit setting the threshold voltage level so that, for example, any power supply perturbations, including voltage spikes such as due to the switching on or off of output loads, will result in identical frequency responses and amplitude versus time responses for the input signal generators and threshold voltage level circuit and prevent an erroneous output from being generated. The time constants of the circuits may be matched by changing the equivalent resistance, capacitance, or inductance of either the input signal generator circuits or the threshold voltage level circuit to increase or decrease their time constants. With the time constants of the circuits matched, only one power supply is required to supply power to the output loads and to the more sensitive logic circuit. Prior art logic circuits already employing one power supply may, with our inventive method, decrease the voltage swing between a signal's high and low state, thus increasing switching speed, without increasing the probability of an erroneous output.

DETAIL DESCRIPTION

Our inventive method to match time constants of one or more input signal generator circuits with that of a circuit responsible for setting a threshold voltage level is described hereinbelow with reference to FIG. 3.

Figure 3:
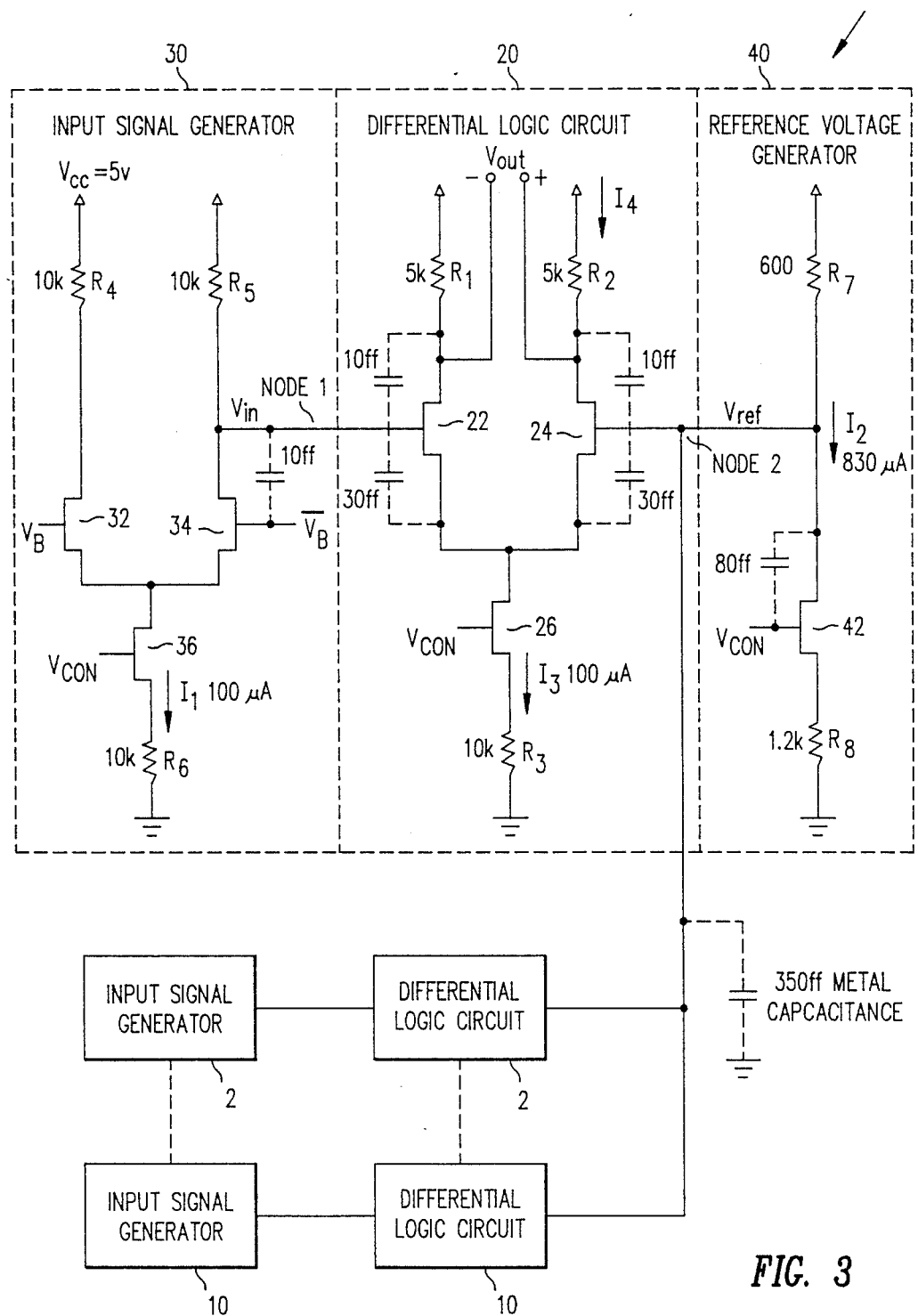
FIG. 3 is a schematic diagram of a logic circuit with parasitic capacitances shown, wherein the time constants of an input signal generator and a reference voltage generator circuit are made equal at node of interest using our inventive method.

FIG. 3 is a schematic diagram of a logic circuit 18 used to sense the state of a certain voltage $V_B$, such as a data bit, and provide an output voltage $V_{out}$ corresponding to the state of that voltage. Logic circuit 18 includes differential logic circuit 20, which is a differential amplifier with inputs being input voltage $V_{in}$, $V_{in}$ being the output of input signal generator 30, which is itself a logic circuit, and reference voltage $V_{ref}$, $V_{ref}$ being the output of reference voltage generator 40. The output voltage $V_{out}$ of differential logic circuit 20 is dependent on the difference between $V_{in}$ and $V_{ref}$. Input signal generator 30 and reference voltage generator 40 are designed so that $V_{in}$ increases or decreases along with $V_{ref}$ when, for example, ambient temperature varies or supply voltage $V_{cc}$ varies, so that the difference between these two signals remain constant despite their absolute changes in amplitude. Abrupt changes in supply voltage $V_{cc}$, however, causes $V_{in}$ and $V_{ref}$ to fluctuate dissimilarly if the frequency response and amplitude versus time response of input signal generator 30 and reference voltage generator 40, as determined by the time constants of the two circuits, are different. If the divergence of the signals exceeds a predetermined amount, an erroneous output voltage $V_{out}$ will be generated. The novel feature of the present invention is that the time constants of input signal generator 30 and reference voltage generator 40 are made substantially identical. This is accomplished by establishing the time constants of one of the circuits and adjusting the components of the other circuit so that both circuits have substantially identical frequency responses and amplitude versus time responses to surges on the power supply line. The schematic diagram of FIG. 3 will now be described in detail followed by a preferred method to match frequency responses and amplitude versus time responses.

In FIG. 3, components of logic circuit 18 are shown along with the parasitic capacitances associated with the circuit. Differential logic circuit 20 comprises transistors 22 and 24, which can be, for example, N-channel MOSFETs, N-channel MESFETs, or NPN bipolar transistors, with input voltage $V_{in}$ applied to the control terminal of transistor 22 and reference voltage $V_{ref}$ applied to the control terminal of transistor 24. Assuming transistors 22 and 24 are MESFETs, supply voltage $V_{cc}$ is coupled to the drains of transistors 22 and 24 through resistors $R_1$ and $R_2$, respectively. The sources of transistors 22 and 24 are made common and are coupled to ground through current controlling transistor 26 and resistor $R_3$ in series. Control voltage $V_{con}$ is applied to the control terminal of transistor 26 to control the current through resistor $R_3$. Output voltage $V_{out}$ is the voltage difference between the voltages on the drains of transistors 22 and 24, or alternatively, that voltage at the drain of transistor 22 or 24. The difference voltage, however, provides better common-mode rejection and will constitute $V_{out}$ in FIG. 3.

Input signal generator 30 comprises transistors 32 and 34, with voltage $V_B$ applied to the control terminal of transistor 32 and the inverse $\overline{V}_B$ of voltage $V_B$ applied to the control terminal of transistor 34. Supply voltage $V_{cc}$ is coupled to the drains of transistors 32 and 34 through resistors $R_4$ and $R_5$, respectively. The sources of transistors 32 and 34 are made common and are coupled to ground through current controlling transistor 36 and resistor $R_6$ in series. Control voltage $V_{con}$ is applied to the control terminal of transistor 36 to control the current through resistor $R_6$. The output of input signal generator 30, $V_{in}$, is that voltage at the drain of transistor 34.

Reference voltage generator 40 comprises current controlling transistor 42 with the drain of transistor 42 coupled to supply voltage $V_{cc}$ through resistor $R_7$ and the source of transistor 42 coupled to ground through resistor $R_8$. Control voltage $V_{con}$ is applied to the control terminal of transistor 42 to control the current through resistors $R_7$ and $R_8$. The output of reference voltage generator 40, $V_{ref}$, is that voltage at the drain of transistor 42.

Coupled to reference voltage $V_{ref}$ are input signal generator/differential logic circuit pairs 2 through 10, though more may be added, illustrating that reference voltage $V_{ref}$ is shared by a number of other circuits.

The operation of logic circuit 18 is next described. When a high $V_B$ signal is applied to the control terminal of transistor 32 and the inverse of $V_B$ (i.e., a low state signal) is applied to the control terminal of transistor 34, transistor 32 conducts a relatively high current while transistor 34 conducts a relatively low current. The sum of these currents, $I_1$, is kept constant by transistor 36. The reduced current through transistor 34 and resistor $R_5$ causes a reduced voltage drop across $R_5$ and, consequently, an increased $V_{in}$, representing a high state. When a low state signal is applied to the control terminal of transistor 32 and the inverse of the signal is applied to the control terminal of transistor 34, $V_{in}$ is reduced, representing a low state.

Reference voltage $V_{ref}$, which is to be compared with input voltage $V_{in}$, is directly determined by the current $I_2$ through resistor $R_7$. Reference voltage $V_{ref}$, thus, equals $V_{cc}-I_2R_7$. Control voltage $V_{con}$ is set so that reference voltage $V_{ref}$ is approximately equal to $[V_{in(high)}+V_{in}(low)]/2$ in order to make $V_{ref}$ be at the midpoint of the $V_{in}$ voltage swing.

When $V_{in}$ is in a high state, the current through transistor 22 is increased, drawing increased current through resistor $R_1$ and lowering the voltage at the drain of transistor 22. The increased current through transistor 22 causes the voltage at the drain of current controlling transistor 26 to rise and, hence, the voltage at the source of transistor 24 to rise, resulting in transistor 24 conducting less current. The reduced current, $I_4$, through resistor $R_2$ results in a reduced voltage drop across resistor $R_2$, producing an increased voltage at the drain of transistor 24. The difference in voltages at the drains of transistors 22 and 24 now represents a high state. A low input voltage $V_{in}$ would raise the voltage at the drain of transistor 22 and decrease the voltage at the drain of transistor 24 resulting in $V_{out}$ representing a low state.

The parasitic capacitance of the various components and metal lead lines are shown with dashed lines. Inductances are negligible in this example but may be significant where metal lead lines are long. In order to equalize the time constants of input signal generator 30 and reference voltage generator 40, as seen at node 1 and node 2, respectively, the time constants of input signal generator 30 and reference voltage generator 40 are calculated, or approximated, by well-known techniques and further defined using computer simulation, as in the preferred method. For logic circuit 18 in FIG. 3, the time constants at node 2 are made substantially identical to the time constants at node 1 by adjusting the value of resistor $R_7$. Once the time constants of both circuits are substantial identical, the value of resistor $R_8$ and the current through transistor 42 are adjusted to provide the proper voltage drop across resistor $R_7$ in order to achieve the desired reference voltage $V_{ref}$.

In the particular case of logic circuit 18, the time constants of reference voltage generator 40 are made substantially identical to those of input signal generator 30 by making resistor $R_7$ equal 600Ω. To achieve the desired $V_{ref}$, which is 4.5 volts in this particular case, a current of 830μA must flow through the 600Ω resistor to give a 0.5 volt drop across $R_7$. The value of resistor $R_8$ is made 1.2KΩ so that the gate-to-source voltage on current controlling transistor 42, given a fixed control voltage $V_{con}$, will result in a current of 830μA through $R_7$.

Figure 1:
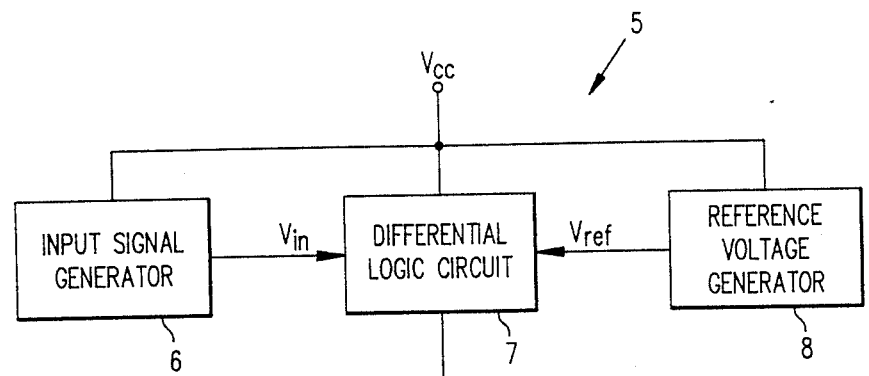
FIG. 1 is a block diagram representative of a typical prior art logic circuit.
Figure 2:
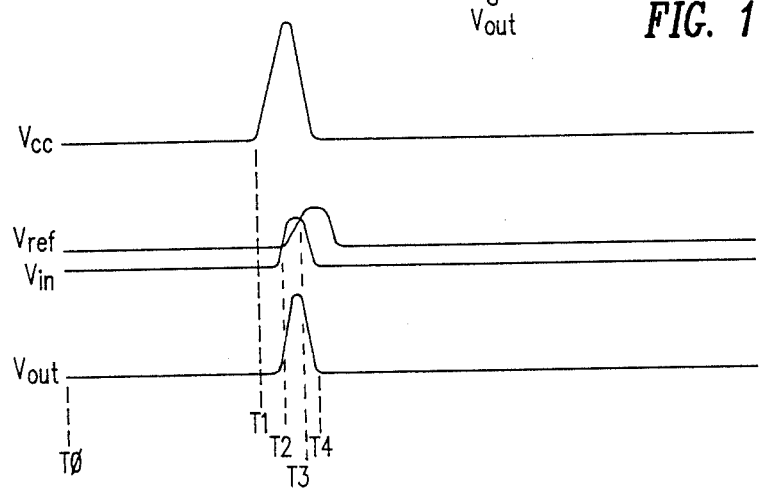
FIG. 2 illustrates the effect on various voltage amplitudes within a logic circuit due to a voltage spike on the power supply line.
Figure 4:
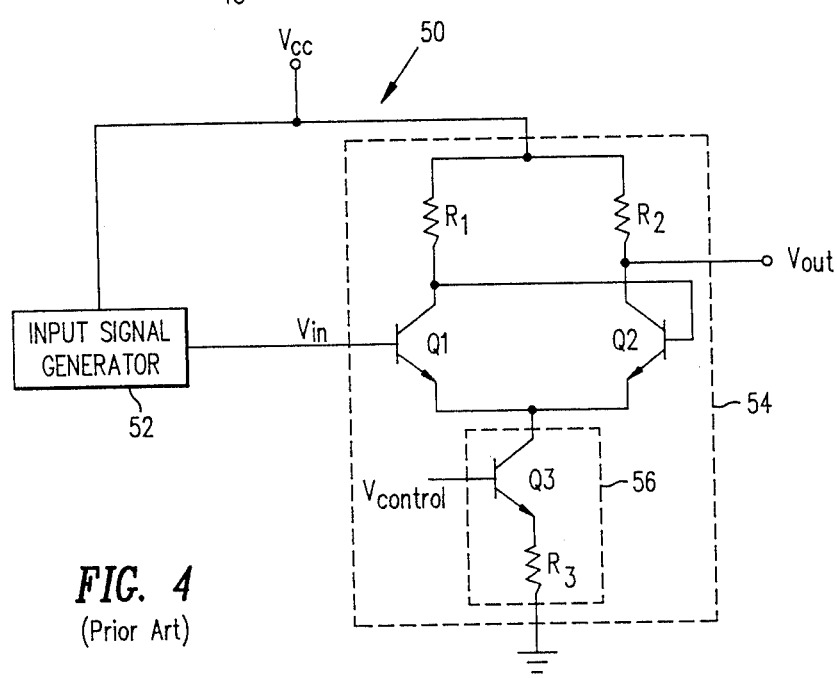
FIG. 4 is a schematic diagram of a logic circuit illustrating a different type of threshold voltage level generator from that of the circuit in FIG. 3.

It is to be noted that our invention is applicable to a variety of circuits wherein the state or level of an input signal is referenced to an internal threshold voltage. For example, in FIG. 4, logic circuit 50 includes input signal generator 52, generating an input voltage $V_{in}$, and output voltage generator 54, generating an output voltage $V_{out}$ and establishing a threshold voltage $V_{th}$. In logic circuit 50, a high state $V_{in}$ applied to the base of transistor $Q_1$ increases the current through $Q_1$ and increases the voltage drop across $R_1$. The decreased voltage at the collector of Q1 is applied to the base of transistor Q2, hence, reducing the voltage drop across resistor R2 and raising $V_{out}$ to a high state. The threshold level of circuit 54 is determined by the parameters of current source 56, formed by transistor Q3 and resistor R3, and transistors Q1 and Q2. As is apparent, a perturbation on power supply voltage $V_{cc}$ will cause both $V_{in}$ and $V_{th}$ to fluctuate. By matching the time constants of input signal generator 52 and output voltage generator 54, $V_{in}$ and $V_{th}$ will fluctuate similarly.

Thus, using the methods described above, logic circuits of the type herein described are essentially immune from power supply surges, and a single power supply may be used to power both the logic circuits and output circuits. An additional stage may also be added as opposed to adjusting internal components in order to adjust the time constants of one circuit.

It should be noted that parasitic capacitances and inductances may be formed by metal lines in close proximity, or if a line is relatively long. These lines should be taken into consideration in determining equivalent RC or LRC time constants.

The concept behind the preferred embodiment of the inventive device and method described above may be applied to a variety of circuits wherein both a threshold voltage and one or more input signals are affected by a common voltage. Accordingly, where the invention has been particularly shown and described with reference to the preferred embodiment thereof, it will be understood by those skilled in the art that deviations may be made therein without departing from the spirit and scope of the invention.

We claim:

1. An improved logic circuit comprising:
   one or more input voltage generator means which produce input voltages whose magnitudes are related to an externally generated certain voltage level; and
   a threshold detection means having a threshold level related to said certain voltage level and having applied to it said input voltages for determining the magnitudes of said input voltages, said one or more input voltage generator means and said threshold detection means having matched frequency responses and amplitude versus time responses so that said input voltages and said threshold level respond similarly to abrupt changes in said certain voltage level.

2. The logic circuit of claim 1 wherein said frequency responses and amplitude versus time responses are matched by making time constants of said one or more input voltage generator means and said threshold detection means substantially identical to one another.

3. The logic circuit of claim 2 wherein said time constants are made substantially identical by adjusting the equivalent resistances, capacitances, or inductances of said one or more input voltage generator means and said threshold detection means.

4. A logic circuit wherein a first input terminal of a threshold detection circuit has applied to it a reference voltage generated by a reference voltage generator circuit and one or more additional input terminals have applied to them one or more input voltages generated by one or more input voltage generator circuits, wherein the frequency response and amplitude versus time response of said reference voltage generator circuit is substantially identical to the frequency response and amplitude versus time response of said one or more input voltage generator circuits so that any perturbations of a certain voltage commonly coupled to said reference voltage generator circuit and said one or more input voltage generator circuits will result in these circuits having substantially identical responses.

5. The logic circuit of claim 4 wherein said certain voltage is a power supply voltage.

6. The circuit of claim 5 wherein said frequency responses and said amplitude versus time responses of said reference circuit and said one or more input voltage generator circuits are made substantially identical by increasing or reducing the equivalent resistance of said reference voltage generator circuit.

7. The circuit of claim 5 wherein said frequency responses and said amplitude versus time responses of said reference circuit and said one or more input voltage generator circuits are made substantially identical by increasing or reducing the equivalent capacitance of said reference voltage generator circuit.

8. The circuit of claim 5 wherein said frequency responses and said amplitude versus time responses of said reference circuit and said one or more input voltage generator circuits are made substantially identical by increasing or reducing the equivalent inductance of said reference voltage generator circuit.

9. The circuit of claim 5 wherein said frequency responses and said amplitude versus time responses of said reference circuit and said one or more input voltage generator circuits are made substantially identical by increasing or reducing the equivalent inductance of said reference voltage generator circuit.

10. The circuit of claim 5 wherein said frequency responses and said amplitude versus time responses of said reference circuit and said one or more input voltage generator circuits are made substantially identical by increasing or reducing the equivalent capacitance of said one or more input voltage generator circuits.

11. The circuit of claim 5 wherein said frequency responses and said amplitude versus time responses of said reference circuit and said one or more input voltage generator circuits are made substantially identical by increasing or reducing the equivalent inductance of said one or more input voltage generator circuits.

12. A method to improve the operation of a circuit of the type having a threshold level determined by a threshold level generator means, wherein one or more input voltages generated by one or more input voltage generator means are referenced to said threshold level to determine the state(s) of said one or more input voltages, and wherein said one or more input voltages and said threshold level are related to a certain voltage level, the improvement comprising matching frequency responses and amplitude versus time responses of said one or more input voltage generator means and said threshold level generator means so that an abrupt change in said certain voltage level coupled to said one or more input signal generator means and said threshold level generator means will produce substantially identical frequency responses and amplitude versus time responses in said one or more input voltage generator means and said threshold level generator means.

13. The method of claim 12 further characterized in that said frequency responses and amplitude versus time responses are matched by matching time constants of said one or more input voltage generator means and said threshold level generator means.

14. The method of claim 13 wherein said certain voltage level is a power supply voltage level.

* * * * *